United States Patent
Kawabata et al.

(10) Patent No.: US 6,875,029 B2
(45) Date of Patent: Apr. 5, 2005

(54) ELECTRICAL CONTROL UNIT

(75) Inventors: Akira Kawabata, Hoi-gun (JP);
Yasumitsu Tanaka, Nakashima-gun (JP); Yuichiro Fukaya, Aichi-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/634,820

(22) Filed: Aug. 6, 2003

(65) Prior Publication Data
US 2004/0027767 A1 Feb. 12, 2004

(30) Foreign Application Priority Data

Aug. 9, 2002 (JP) ........................................ 2002-233719

(51) Int. Cl.⁷ .............................................. H01R 9/09
(52) U.S. Cl. ..................................................... 439/76.2
(58) Field of Search .............................. 439/76.2, 76.1, 439/34; 361/797, 752, 704, 707, 710, 728, 753, 796, 719; 174/17.08; 29/832

(56) References Cited

U.S. PATENT DOCUMENTS

| | | | | |
|---|---|---|---|---|
| 4,218,724 A | * | 8/1980 | Kaufman | 361/736 |
| 4,409,641 A | * | 10/1983 | Jakob et al. | 361/720 |
| 4,533,976 A | * | 8/1985 | Suwa | 361/736 |
| 4,639,062 A | * | 1/1987 | Taniguchi et al. | 439/586 |
| 4,858,071 A | * | 8/1989 | Manabe et al. | 361/720 |
| 5,461,542 A | * | 10/1995 | Kosak et al. | 361/710 |
| 5,657,203 A | * | 8/1997 | Hirao et al. | 361/707 |
| 5,699,235 A | * | 12/1997 | Tsurumiya et al. | 361/803 |
| 5,812,375 A | * | 9/1998 | Casperson | 361/707 |
| 6,028,770 A | * | 2/2000 | Kerner et al. | 361/704 |
| 6,354,674 B1 | * | 3/2002 | Iwamoto et al. | 303/119.3 |
| 6,368,119 B2 | * | 4/2002 | Murakami | 439/76.2 |
| 6,442,027 B2 | * | 8/2002 | Sanada et al. | 361/704 |
| 6,560,115 B1 | * | 5/2003 | Wakabayashi et al. | 361/728 |
| 6,599,135 B2 | * | 7/2003 | Yamane | 439/76.2 |
| 6,600,653 B2 | * | 7/2003 | Koike et al. | 361/704 |
| 6,671,183 B2 | * | 12/2003 | Tsuzuki | 361/797 |

FOREIGN PATENT DOCUMENTS

| | | |
|---|---|---|
| EP | 0 708 583 A1 | 4/1996 |
| FR | 2 746 736 | 10/1997 |
| JP | A-10-326983 | 12/1998 |
| JP | A-2002-216886 | 8/2002 |

* cited by examiner

Primary Examiner—Alex Gilman
(74) Attorney, Agent, or Firm—Posz & Bethards, PLC

(57) ABSTRACT

An electronic control unit (ECU) includes onboard type electronic components and non-onboard type electronic components inside an aluminum case. The ECU has a circuit board for mounting the onboard type electronic component in a first portion of a bottom surface, and a concavity for installing the non-onboard type electronic components in a second portion of the bottom surface. A resinous frame is provided in the concavity to house and hold the non-onboard type electronic components.

3 Claims, 5 Drawing Sheets

ELECTRICAL CONTROL UNIT

CROSS REFERENCE TO RELATED APPLICATIONS

This application is based on Japanese Patent Application No. 2002-233719 filed on Aug. 9, 2002, the contents of which are incorporated herein by reference.

BACKGROUND OF THE INVENTION

1. Field of the Invention

The present invention relates to an electrical control unit.

2. Description of Related Art

Electrical control units such as shown in FIG. 5 and FIG. 6 are mass-produced for vehicles. In the unit shown in FIG. 5, a substrate 102 that mounts electronic components 101 is fixed by bonding on a plane plate 100 manufactured by aluminum. Large-size electronic components 104 (such as coils and capacitors), which cannot be mounted on the substrate 102, are held and fixed on a resinous frame 103 that combines a case and a connector. Bus bar (metallic electrical conductor) 105 is inserted into the resinous frame 103. The large-size electronic components 104 are electrically connected to a connective land of the substrate 102 via a lead wire 106, the bus bar 105, and a ribbon wire (metallic foil) 107. The bus bar 105, which is inserted into the resinous frame 103, is used as a conjunctive pin (connector pin) of a connector 108. This unit is mounted on an engine 200.

In the unit shown in FIG. 6, an aluminum case 110 is formed in a box-style, a substrate 111 is fixed by bonding in the aluminum case 110, and all electronic components 112, 113 are soldered on the substrate 111. A connector 114 is fixed to the aluminum case 110, and the aluminum case 110 is fixed on an engine (a vehicle) 200 by using a brim 115 of the aluminum case 110. The aluminum case 110 functions as a heat sink. Thus, most of heat from the electronic components 112, 113 disposed on the substrate 111 is conducted to the aluminum case 110, and the heat is radiated to the engine via the brim 115. A part of the heat is conducted to the case 110 by a radiation and a transmission by the air inside the case 110, and is radiated from the case 110 to the air.

The unit of FIG. 5 can include the large-size electronic components 104, which produce large outputs, in the case. As a result, the unit of FIG. 5 can be used for producing large outputs, such as an injector driver for a diesel engine, and an injector driver for a direct gasoline-injection engine. However, the plane plate 100 and the resinous frame 103 constitute the case, the connector 108, and a support member for the large electronic components, and the bus bar 105 has an outside jutted structure to be used as the connector pin. As a result, width of the bus bar becomes width of the connector pin, and consequently the number of the connector pins is limited (for example, approximately 20 pins).

Recently, the number of the input and output terminals of the electronic control units is increased significantly (for example, 50 pins to 150 pins), and thus the structure of FIG. 5 cannot meet the increase of the terminals physically. As a result, the electronic control units are divided into a unit for a large output and another unit for a small output (control unit). In addition, various kinds of the connector 108 are used. If the shape of the connector is changed as necessary, variations of the case are increased, and consequently this causes a problem that the variations drive up costs for the electronic control units.

On the other hand, the unit of FIG. 6 is limited to use for the small output device (control element). The connector 114 has a capability of a number of the input and output terminals up to around 100 pins to 150 pins by multipurpose small clearance design. However, it is difficult for the structure to install the large-size electronic components 104 as shown in FIG. 5. Even if the substrate 111 included in the aluminum case 110 is a large size, the electronic components may be broken away from the substrate due to an applied vibration and weight of the electronic components itself under a condition that the electronic control units for an internal combustion engine is installed directly to the engine.

SUMMARY OF THE INVENTION

An object of the present invention is to provide an electronic control unit that includes an onboard type electronic component and a non-onboard type electronic component inside a case, and has an improved quakeproof construction and an improved thermal radiation.

According to one aspect of the present invention, in an electronic control unit, a thermally conductive metallic case that has a concavity for installing a non-onboard type electronic component is used as the case. A resinous frame that houses the non-onboard type electronic component is disposed inside the concavity. A metallic electrical conductor inserted into the resinous frame is electrically connected to the circuit board via a metallic foil.

Accordingly, even when the non-onboard type electronic component, which is the large-size electronic component, is disposed in the case, the non-onboard type electronic component is held with the resinous frame, thereby ensuring to have the high vibration resistance. In addition, since the thermally conductive metallic case functions as a heat sink, the onboard type electronic component and the non-onboard type electronic component can release the heat via the case. As a result, the onboard type electronic component and the non-onboard type electronic component are disposed in the case, and quakeproof performance and thermal radiative performance are improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

Figure 1:
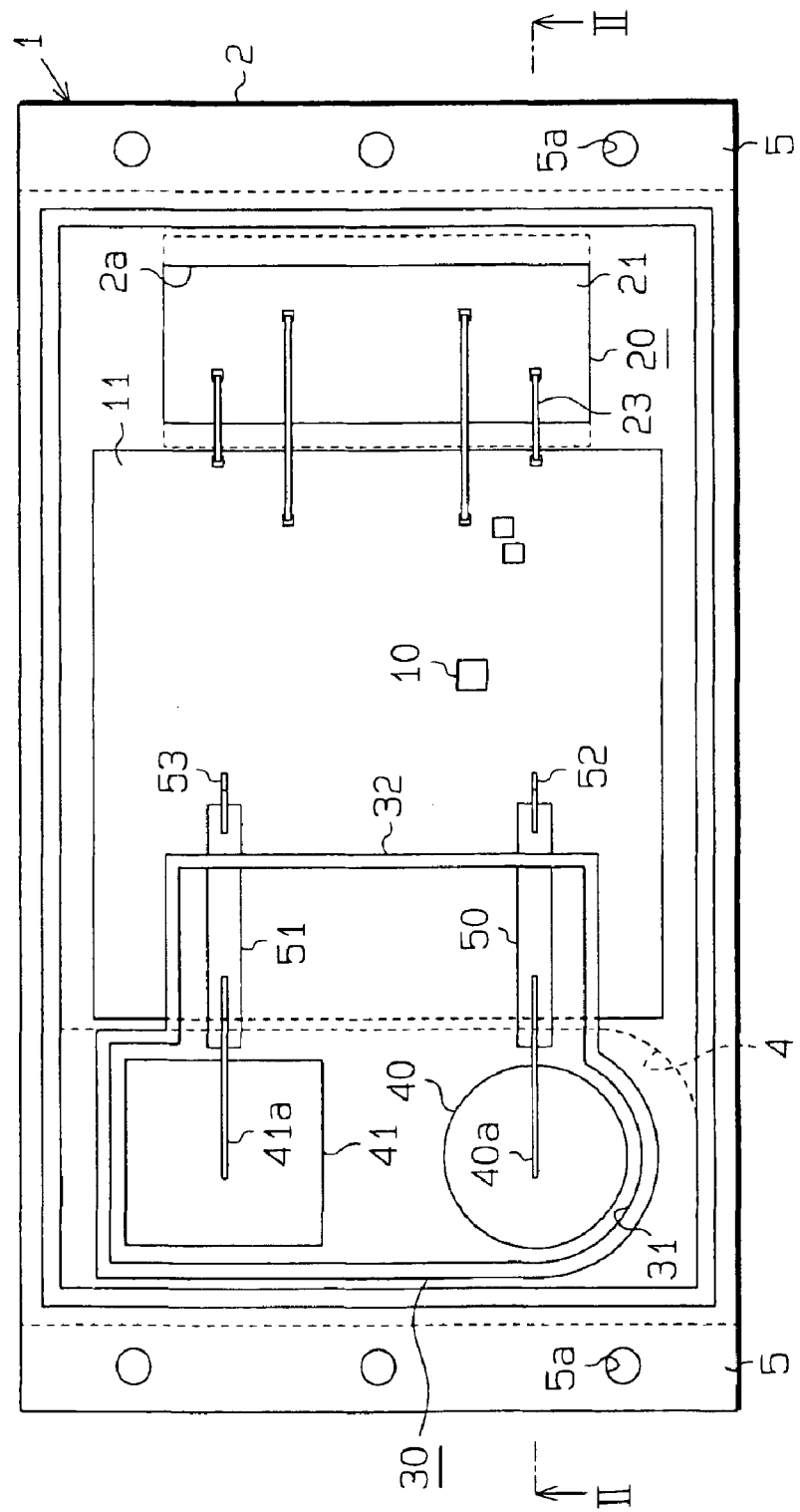
FIG. 1 is a plan view showing an electronic control unit of an embodiment according to the present invention.

The preferred embodiments of the present invention will be explained with reference to the accompanying drawings. In the drawing, the same numerals are used for the same components and devices.

Figure 2:
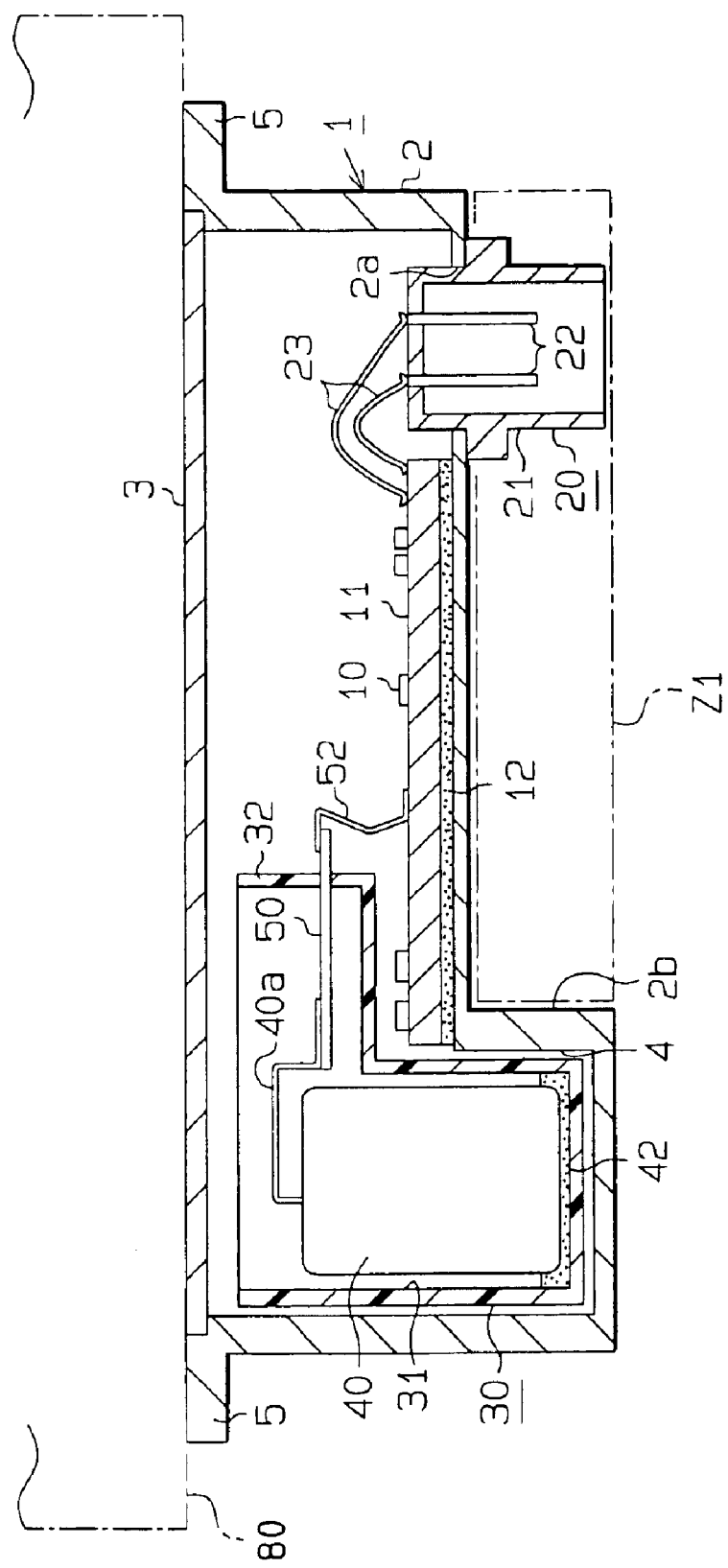
FIG. 2 is a sectional view taken on line II—II in FIG. 1.

An electrical control unit (ECU) 1 shown in FIGS. 1 and 2 is used for the vehicle. It is located in an engine compartment, and it is installed directly on the engine. The unit 1 has a case 2 made of aluminum. The aluminum case 2 is a box-style that has an opening in a top surface, and it has a bottom plate and a sidewall. The opening in the top surface of the aluminum case 2 is covered with the cover 3.

A circuit board 11, which has onboard type electronic components 10, is located at a middle portion of a bottom surface of the aluminum case 2, and fixed by an adhesive 12. A connector 20 is installed at a right side position of the installation location of the circuit board 11 in the bottom surface of the aluminum case 2. That is, the aluminum case 2 is separate from the connector 20. The connector 20 includes a housing 21 that has a cylindrical shape with a bottom plate, and conjunctive pins (connector pins) 22 that pass through and are supported with the connector 20. The housing 21 is inserted into a through-hole 2a provided in the aluminum case 2, and then the connector 20 is fixed to the aluminum case 2 by a bonding material in a condition that the housing 21 is inserted into the through-hole 2a. The circuit board 11 is electrically connected to the conjunctive pins (lead wires) 22 of the connector 20 with bonding wires 23.

On the other hand, a bursiform type protrusion 2b is formed at a left side position of the installation location of the circuit board 11 in the bottom surface of the aluminum case 2. A concavity 4 is provided inside the protrusion 2b to install large-size electronic components (non-onboard type electronic components) 40 and 41. A resinous frame 30 is inserted into the concavity 4 of the aluminum case 2, and is fixed by a bonding. The non-onboard type electronic components 40 and 41 are housed in a storage concavity 31 for the electronic components inside the resinous frame 30, and are fixed by an adhesive 42. The non-onboard type electronic components 40 and 41 are the large-size electronic components for a large output circuit, such as coils and capacitors.

In this way, the bursiform type protrusion 2b is provided in a part of the aluminum case 2, and the large-size electronic components 40 and 41 are installed inside the protrusion 2b (concavity 4) in a hold condition with the resinous frame 30, thereby reducing a whole volume of the ECU 1 and enabling a reduction in size.

In addition, since the resinous frame 30 is insulative, it also functions as an insulating member between the aluminum case 2 and the large-size electronic components 40 and 41. The large-size electronic components 40 and 41 are installed on the resinous frame 30, so that only such onboard type (Surface Mount Device: SMD) electronic components 10, which are small size, are mounted on the circuit board 11. Accordingly, it is possible to downsize the circuit board 11 and to design a fine pattern.

Figure 5:
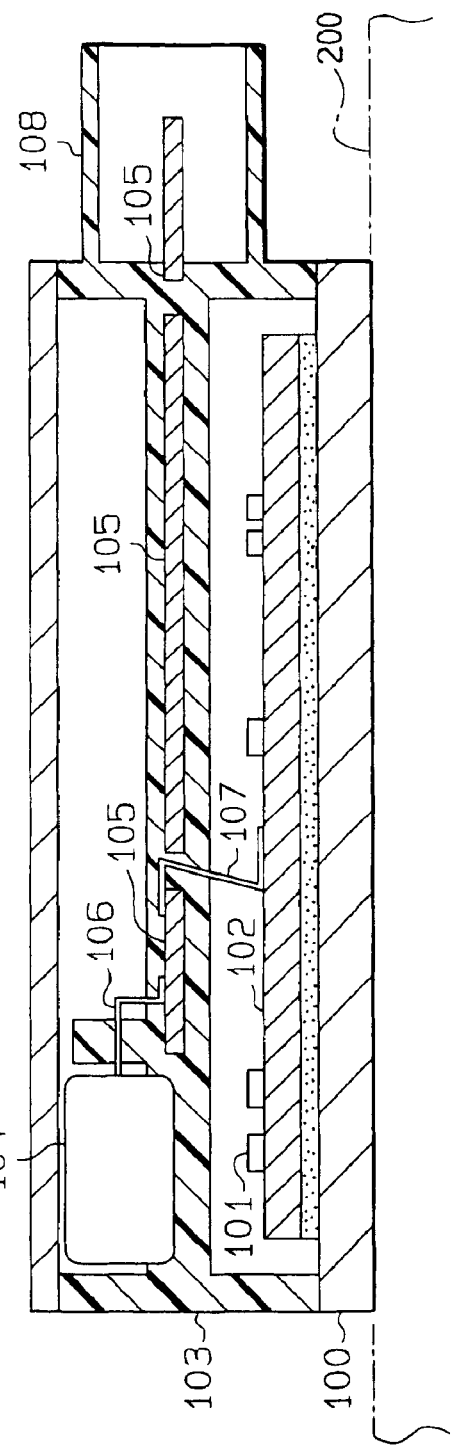
FIG. 5 is a sectional view showing an electronic control unit of a related art.
Figure 6:
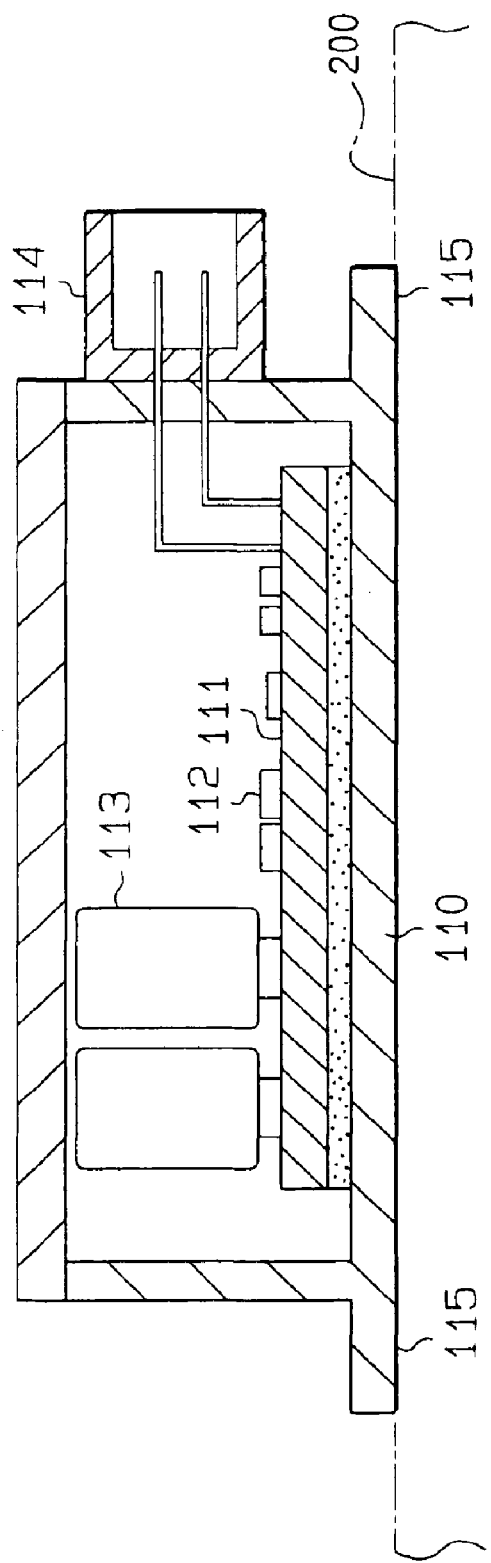
FIG. 6 is a sectional view showing another electronic control unit of another related art.

The resinous frame 30 is designed to minimize its size sufficient to install the large-size electronic components 40 and 41. That is, the resinous frame 30, which does not surround the large-size electronic components as shown in FIG. 5 of the related art, has minimum size that has a function of a seat to hold the components 40 and 41. The aluminum case 2 is structured to have the protrusion 2b only in a location of the large-size electronic components 40 and 41, and to thin another location of the case 2. This reduces a whole volume of the ECU 1. That is, this reduces the volume of a region shown with dotted line Z1 of FIG. 2 with respect to the volume of the aluminum case 2, and enables a reduction in size.

Additionally, performance of a heat radiation is improved because the large-size electronic components 40 and 41 efficiently radiate their heat into surrounding area to be absorbed in the aluminum case 2. The resinous frame 30 itself is not required to have a strength of the case as the structure of the related art shown in FIG. 5. Therefore, the thickness of the resinous frame 30 can be reduced to one-third of a thickness of the related art, a quantity of the resin consumption is reduced, and weight of the resinous frame 30 is reduced.

The non-onboard type electronic components 40 and 41 have lead wires 40a and 40b. The resinous frame 30 has a bus bar support element 32, and the bus bar support element 32 extends toward the right above the circuit board 11. Bus bars (metallic electrical conductor for non-onboard type electronic components) 50 and 51 are passed through the bus bar support element 32, and the bus bars 50 and 51 extend in the horizontal direction. The bus bars 50 and 51 are connected to the lead wires 40a and 41a of the non-onboard type electronic components 40 and 41, respectively, by a resistance welding. Thereby, high vibration resistance against vibrations (10–30 G) is ensured in a condition that the ECU 1 is mounted directly on the engine.

The bus bars 50 and 51 are electrically connected to the circuit board 11 via metallic foils (ribbon wires) 52 and 53, respectively. A mounting brim 5 is molded integrally at the top end of the aluminum case 2, and has through-holes 5a as shown in FIG. 1. The ECU 1 is installed on the engine 80 by screws through the through-holes 5a.

In the connector 20, end portions, which are located in the housing 21, of the conjunctive pins 22 are connected to end of a wire (not shown) via an end connector of the wire to connect the circuit board 11 and an external device. The wire is connected to a battery, various kinds of sensors, and an actuator for controlling the engine. That is, internal elements within the aluminum case 2 of the ECU 1 are connected to the battery, the various kinds of sensors, and the actuator for controlling the engine via the wire. Then, ECU 1 detects a condition of the engine by signals from the sensors, performs various kinds of calculations, and then drives the actuator, such as an injector and an igniter, to control the engine appropriately.

In this embodiment, heat radiated from the onboard type electronic components 10 mounted on the circuit board 11 is mainly conducted to the circuit board 11, then to the adhesive 12, and then to the aluminum case 2. Then, the heat is radiated efficiently from the aluminum case 2 to the engine (vehicle) 80. The heat radiated from the all electronic components 10, 40, and 41 are conducted to the aluminum case 2 as a heat sink, and is radiated efficiently from the mounting brim 5 (mounting element for the ECU) to the engine side 80.

As explained above, in the ECU 1, the non-onboard type electronic components 40 and 41 are housed in the aluminum case 2. The circuit board 11, which has the onboard type electronic components 10, is also housed in the aluminum case 2. The circuit board 11 is electrically connected to the non-onboard type electronic components 40 and 41, and the conjunctive pins 22 of the connector 20 installed in the aluminum case 2 are electrically connected to the circuit board 11.

The aluminum case (good thermally conductive metallic case), which has the concavity 4 for installing the non-onboard type electronic components 40 and 41, is used as the case 2. The resinous frame 30, which has the non-onboard type electronic components 40 and 41, is provided in the concavity 4. The bus bars (metallic electrical conductor for non-onboard type electronic components) 50 and 51 inserted into the resinous frame 30 are electrically connected to the circuit board 11 via the metallic foils 52 and 53.

Accordingly, even when the non-onboard type electronic components 40 and 41, which are the large-size electronic components, are disposed in the aluminum case 2, the non-onboard type electronic components 40 and 41 are held with the resinous frame 30, thereby ensuring the high vibration resistance. In addition, since the aluminum case 2 functions as the heat sink, the onboard type electronic components 10 and the non-onboard type electronic components 40 and 41 can release the heat via the aluminum case 2. As a result, the onboard type electronic components 10 and the non-onboard type electronic components 40 and 41 are disposed in the aluminum case 2, and quakeproof performance and thermal radiative performance are improved.

The large-size electronic components 40 and 41 are mounted on the resinous frame 30, thereby improving the vibration resistance. Accordingly, the ECU 1 is used properly as a vehicular ECU, and especially as a direct-mounted ECU on the engine.

In addition, if a shape of the resinous frame 30 is modified, an installation place of the large-size electronic components 40 and 41, and conjunctive places between the circuit board 11 and the bus bars 50 and 51 are set at any places, thereby improving flexibility of the design with respect to the circuit board 11. This is because it is required to consider the vibration resistance and a path over which the current flows if the large-size electronic components are mounted on the circuit board, and then an installation place of the large-size electronic components is limited.

Additionally, the aluminum case 2, the resinous frame 30, and the connector 20 are structured separately (individually designed), and not by integrally molded. This can suit various kinds of devices to be controlled with flexibility. That is, the aluminum case 2, the resinous frame 30, and the connector 20 are structured separately, so that only a design change of the connector 20 is required in comparison with the integrally molded structure of a connector and a case when the number of inputs and outputs for controlling increase, thereby improving flexibility of the design with respect to the ECU 1. In detail, the ECU 1 can be divided into the aluminum case 2, the connector 20, the resinous frame 30, the circuit board 11, and the cover 3, and then each element can be designed individually.

The whole structure of the non-onboard type electronic components 40 and 41 are disposed (mounted) inside the resinous frame 30. Accordingly, the large-size electronic components 40 and 41 can be located outside the circuit board 11, and only the small-size electronic component such as the onboard type (SMD) electronic components 10 is mounted on the circuit board 11, thereby enabling the size reduction of the circuit board 11 and improving the vibration resistance of that.

The mounting brim 5 is molded integrally to the aluminum case 2, so that the heat is released from the mounting brim 5 to the engine side (vehicle side) that is other mounting end, thereby improving the thermal radiation. If fins are provided to the aluminum case 2, the heat radiation to the air is further improved.

Figure 3:
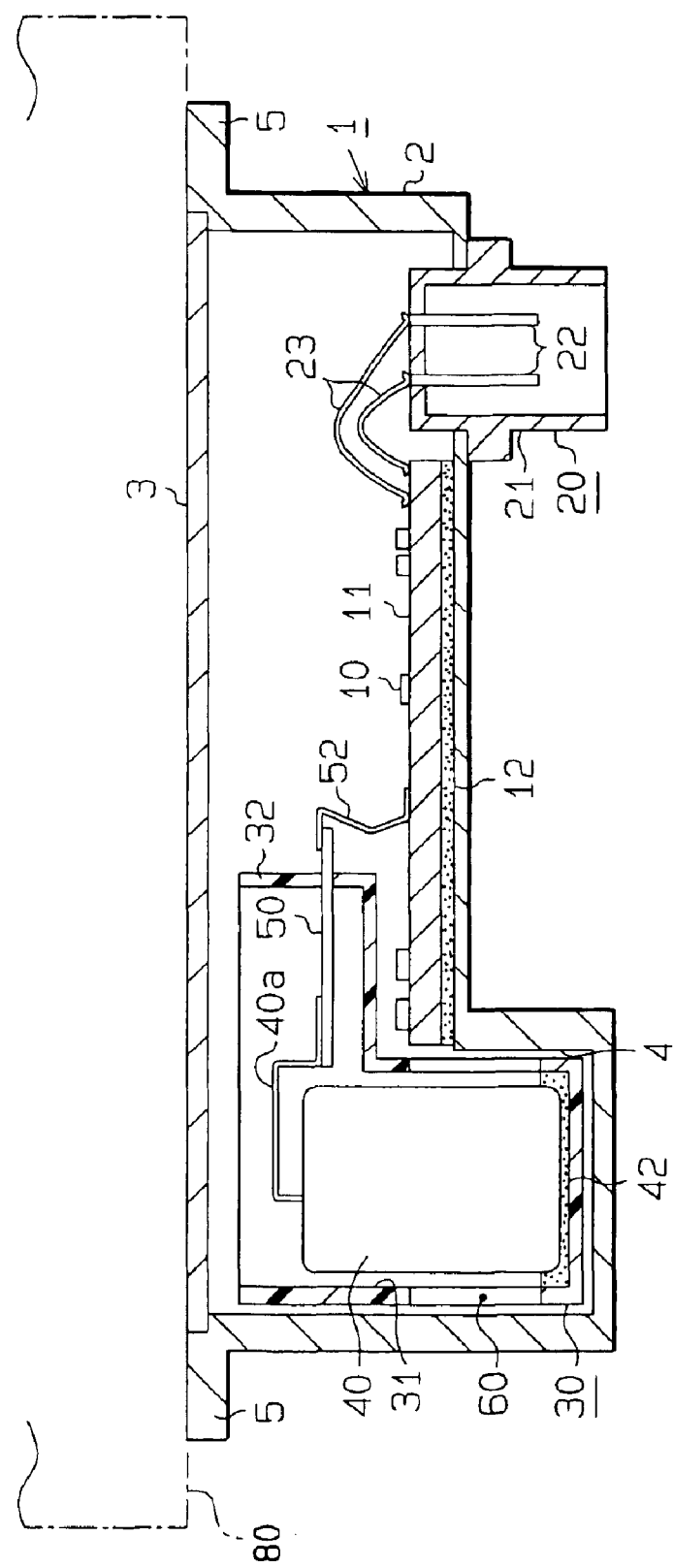
FIG. 3 is a sectional view taken on line II—II in FIG. 1 with respect to a modified embodiment according to the present invention.
Figure 4:
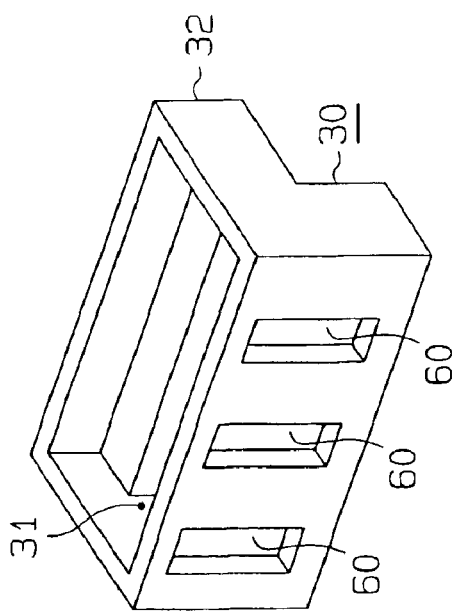
FIG. 4 is a perspective view showing a resinous frame.

The present invention should not be limited to the embodiments discussed above and shown in the figures, but may be implemented in various ways without departing from the spirit of the invention. For example, as shown in FIG. 3, the resinous frame 30 may have slits (through holes) 60 as thermally radiative windows. In detail, as shown in FIG. 4, a lot of square slits (through holes) 60 are disposed at a sidewall of the storage concavity 31 of the resinous frame 30. Thus, the heat tends to be conducted to the aluminum case 2 through the slits 60. Accordingly, the heat radiation from the large-size electronic components 40 and 41 is improved. Since the resinous frame 30 has low thermal conductivity, the sidewall of the resinous frame 30 functions as a heat insulative material. For this reason, the slits 60 are disposed, so that the heat from the electronic components 40 and 41 is easily conducted to the aluminum case 2 through the air at the places of the slits 60.

What is claimed is:

1. An electronic control unit, comprising:
    a case that is made of a thermally conductive metallic and has a first portion of a bottom surface and a second portion of the bottom surface, and a concavity disposed in the second portion of the bottom surface;
    a circuit board disposed in the first portion of the bottom surface;
    an onboard type electronic component disposed on the circuit board;
    a resinous frame disposed in the concavity; and
    a non-onboard type electronic component housed in the resinous frame.

2. The electronic control unit according to claim 1, wherein the circuit board is electrically connected to the non-onboard type electronic component via a metallic foil.

3. The electronic control unit according to claim 1, further comprising a conjunctive pin that is electrically connected to the circuit board.

* * * * *